United States Patent [19]

Johnson

[11] 4,142,603

[45] Mar. 6, 1979

[54] ADJUSTABLE SPEAKER CABINET

[76] Inventor: Rubein V. Johnson, 2432 Court St., Muskogee, Okla. 74401

[21] Appl. No.: 743,808

[22] Filed: Nov. 22, 1976

[51] Int. Cl.$^2$ .......................... G10K 13/00; H05K 5/00

[52] U.S. Cl. .......................... 181/148; 181/155; 181/156; 181/160; 181/163; 181/199

[58] Field of Search .............. 181/148, 156, 160, 155, 181/158, 199, 163; 179/1 E, 116

[56] References Cited

U.S. PATENT DOCUMENTS

| | | | |
|---|---|---|---|
| 1,988,250 | 1/1935 | Olson | 179/116 |
| 2,834,423 | 5/1958 | Bradford | 181/156 |
| 3,727,719 | 4/1973 | Yando | 179/1 E |
| 3,777,844 | 12/1973 | Johnson | 181/199 |
| 3,980,154 | 9/1976 | Johnson | 181/160 |

*Primary Examiner*—Stephen J. Tomsky
*Attorney, Agent, or Firm*—Head, Johnson & Chafin

[57] ABSTRACT

A cabinet for improving the sound output of an amplifier, the cabinet being in the form of an upright rectangular housing with a horizontal partition dividing the interior into an upper and lower portion, the partition having a speaker opening and a baffle opening, a speaker being mounted in the speaker opening for upward projection of the sound into the housing upper portion, the speaker being connected to the amplifier, a sounding board within the housing upper portion inclined at an angle from the housing rear upwardly towards the housing front, a sheet of metal affixed to the horizontal partition and covering the baffle opening, the vibration of the speaker serving to drive the metal baffle by condensations and rarefaction of the sound waves to either side of the horizontal partition so that the metal baffle functions as a supplemental and complementary sound source.

7 Claims, 14 Drawing Figures

ADJUSTABLE SPEAKER CABINET

BACKGROUND AND OBJECTS OF THE INVENTION

The conversion of an electrical signal into an audio signal requires a speaker in the form of a diaphragm having a coil affixed thereto in a magnetic field, the electrical signal being used to oscillate the diaphragm. The compression and rarefaction of the air surrounding the speaker is easily short-circuited back and forth around the edges of the speaker, therefore, to achieve good sound transmission a speaker cabinet is required. A good speaker cabinet refines the tonal quality of the sound produced by the speaker.

For background information as to types of speaker cabinets which provide improved speaker performance refer to my prior issued U.S. Pat. No. 3,777,844, entitled "ADJUSTABLE SPEAKER CABINET", issued Dec. 11, 1973, and to my U.S. application Ser. No. 617,046, entitled, "CABINET FOR IMPROVING THE SOUND OUTPUT OF AN AMPLIFIER," filed Sept. 26, 1975 now U.S. Pat. No. 3,980,154.

It is an object of this invention to provide an improved cabinet for a speaker.

More particularly, an object of this invention is to provide an improved speaker cabinet of upright rectangular construction having an inner horizontal partition dividing the interior of the cabinet into an upper and lower portion and having an opening in the partition in which the speaker is mounted for projecting sound upwardly into the upper portion, and having a second opening covered by a baffle plate, the baffle plate acting in response to the condensation and rarefactions of the air to either side of the baffle plate as imposed by the actuation of the speaker to function as a supplemental sound producing apparatus.

It is another object of this invention to provide various sound conditioning devices and apparatus which may be utilized with the basic cabinet to selectively tune the sound produced in the cabinet to enable the individual to customize the speaker cabinet to his preselected sound preference.

Another object of this invention is to provide a sound lens for use in a speaker cabinet for transmitting sound from one part of the cabinet to another or for transmitting sound from the interior to the exterior of the cabinet.

These and other objects and a better understanding of the invention will be had by reference to the description and claims taken in conjunction with the drawings.

DESCRIPTION OF THE VIEWS

FIGS. 5 through 11B show details of sound customizing devices which may be employed with the speaker cabinets shown in FIGS. 1A through 4 to adjust the sound output of the speaker cabinet to the characteristics desired of the user.

FIG. 5 is a cross-sectional view of an acoustic lens element which may be inserted into the baffle opening in the horizontal partition or which may be inserted in the lower front panel of the speaker cabinet as shown in FIG. 1A.

FIG. 6 is a cross-sectional view of an alternate design of the acoustic lens element having the same function as that of FIG. 5, but producing different sound results.

FIG. 8 is a perspective view of an alternate device for insertion into an opening in the speaker cabinet horizontal partition to change the sound outputs through the baffle and to selectively direct the sound outwardly through the front of the speaker cabinet.

FIG. 9 is a cross-sectional view taken along 9—9 of FIG. 8.

FIG. 10 is a cross-sectional view of a still different device for positioning in the baffle opening of the partition to change the sound output of the baffle plate.

FIG. 11B is a cross-sectional view of the sound tube taken along the line 11B—11B of FIG. 11A.

SUMMARY OF THE INVENTION

Figure 1B:
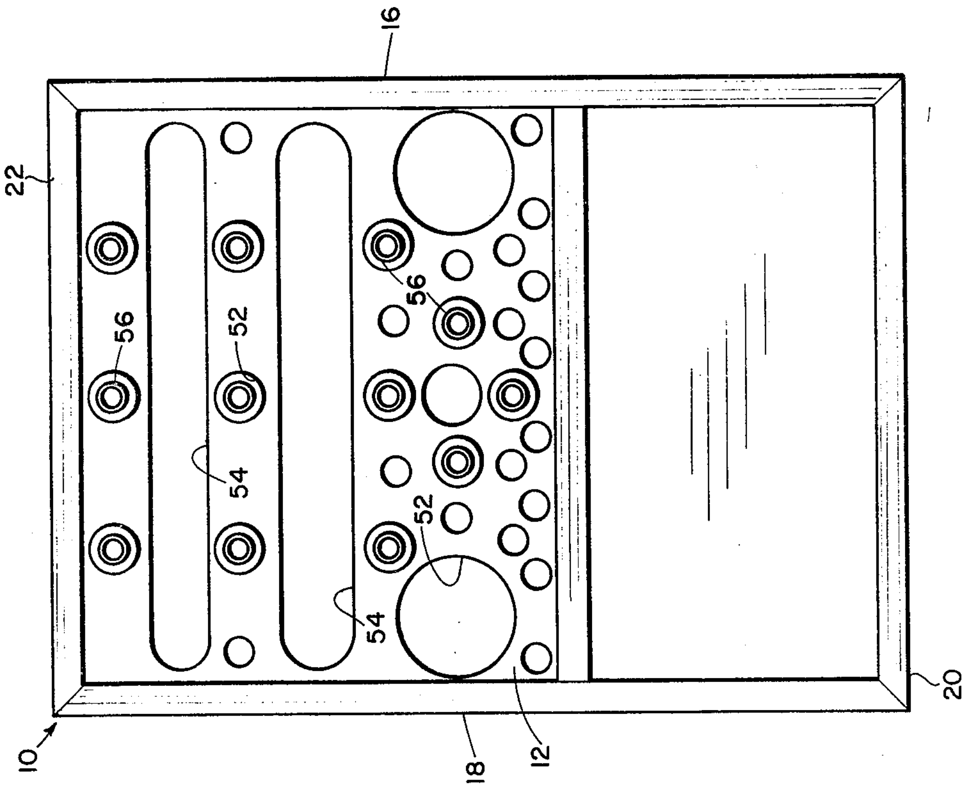
FIG. 1B is an alternate arrangement of the front elevational view of the speaker cabinet.

A cabinet for improving the sound output of an amplifier is disclosed, the cabinet being in the form of an upright rectangular housing having an intermediate horizontal partition dividing the interior of the housing into an upper and lower portion. The horizontal partition has a speaker opening and at least one baffle opening, the speaker and baffle openings being spaced apart from each other. A speaker is mounted to the partition in the speaker opening and oriented to direct sound upwardly from the lower to the upper portion of the speaker cabinet interior, and each baffle opening has a metal baffle plate thereacross, the baffle plate functioning to vibrate in response to the sound wave condensations and rarefactions produced by the speaker and to thereby generate sound. The upper portion of the cabinet interior has a sounding board sloping from the lower back to the upper front so that sound produced by the speaker and the baffle plate or sound lens is reflected off the sounding board and through the upper front portion of the speaker cabinet which has openings therein for sound passage. An important novel aspect of the speaker cabinet is the incorporation of one or more baffle plates in the horizontal partition to supplement and augment the sound produced by the speaker. Further, a variety of devices are provided which may be utilized to change the sound characteristics of the speaker cabinet and particularly sound produced by the baffle plate to enable the user to selectably arrange the specific characteristics of the sound to suit his individual taste.

DETAILED DESCRIPTION

Referring now to the drawings and first to FIGS. 1A, 1B, 2, 3 and 4, a speaker cabinet which incorporates the principles of this invention is generally indicated by the numeral 10. The cabinet 10 is of rectangular upright construction, including a front 12, a rear 14, side wals 16 and 18, a bottom 20 and top 22.

Within the interior of cabinet 10 is a horizontal partition 24 which divides the interior of the cabinet into an upper and lower chamber. The lower chamber 26 is closed on the bottom, front and sides, and, as shown in the rear view of FIG. 2, has openings 28 in the lower portion 14A of the rear panel. The total area of openings 28 in rear lower panel 14A should not exceed the horizontal area of the speaker which will be described subsequently.

The upper chamber of cabinet 10 is divided into a forward portion 30 and a rearward portion 32 by a sounding board 34. The sounding board is positioned to extend from the rearward lower portion of the cabinet upper chamber to the upper forward portion at an angle A as shown in FIG. 4 of between about 30° to 70° relative to the horizontal position 24.

Figure 3:
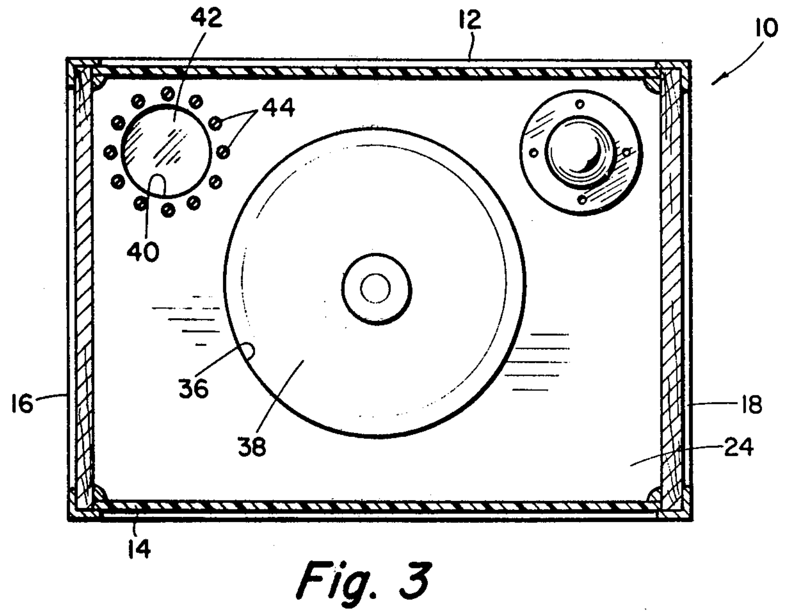
FIG. 3 is a cross-sectional view taken along the line 3—3 of FIG. 2 showing the horizontal partition.
Figure 2:
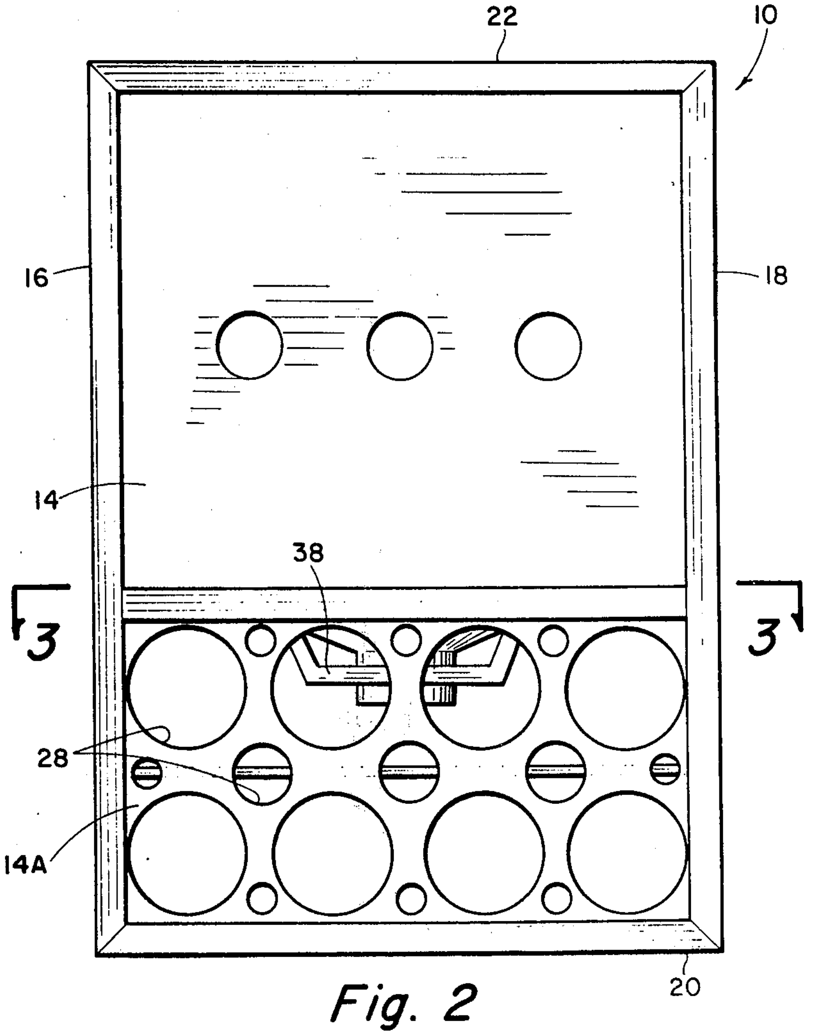
FIG. 2 is a rear elevational view of a cabinet of FIGS. 1A or 1B.

Formed in the horizontal partition 24 is a speaker opening 36 (See FIG. 3). Attached to the lower surface of sounding board 24 is a speaker 38 (See FIG. 4) which, when energized by an amplifier, directs sound upwardly through the opening 36 into the upper interior portion of the cabinet where the sound impinges upon the sounding board 34 and is reflected outwardly through the upper portion of front panel 12.

Formed in the horizontal partition 24 are one or more baffle openings 40. At least one baffle opening 40 is required to practice the invention. Two openings 40 are preferred; however, more than two may also be employed. The baffle openings are spaced away from the speaker opening 36 and are preferably dimensioned to provide a total of less than one-fourth the area of the speaker opening. Covering baffle opening 40 is a baffle plate 42 supported to the horizontal partition 24 by means such as bolts 44 and nuts 46. Baffle plates 42 are preferably of metal, such as aluminum or steel, and preferably of about 14 gauge thickness.

Figure 4:
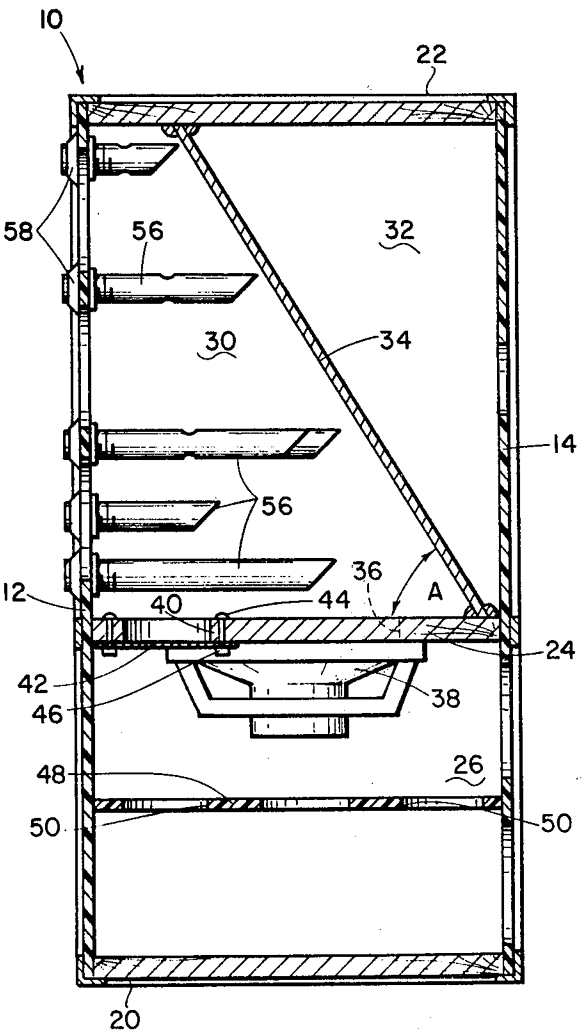
FIG. 4 is a cross-sectional view taken along the line 4—4 of FIG. 1A showing more details of the interior construction of the speaker cabinet.

The cabinet lower chamber 26 may be provided, as illustrated in FIG. 4, with a horizontal baffle board 48 having openings 50 therein; however, the use of the lower baffle board 48 is optional.

Figure 1A:
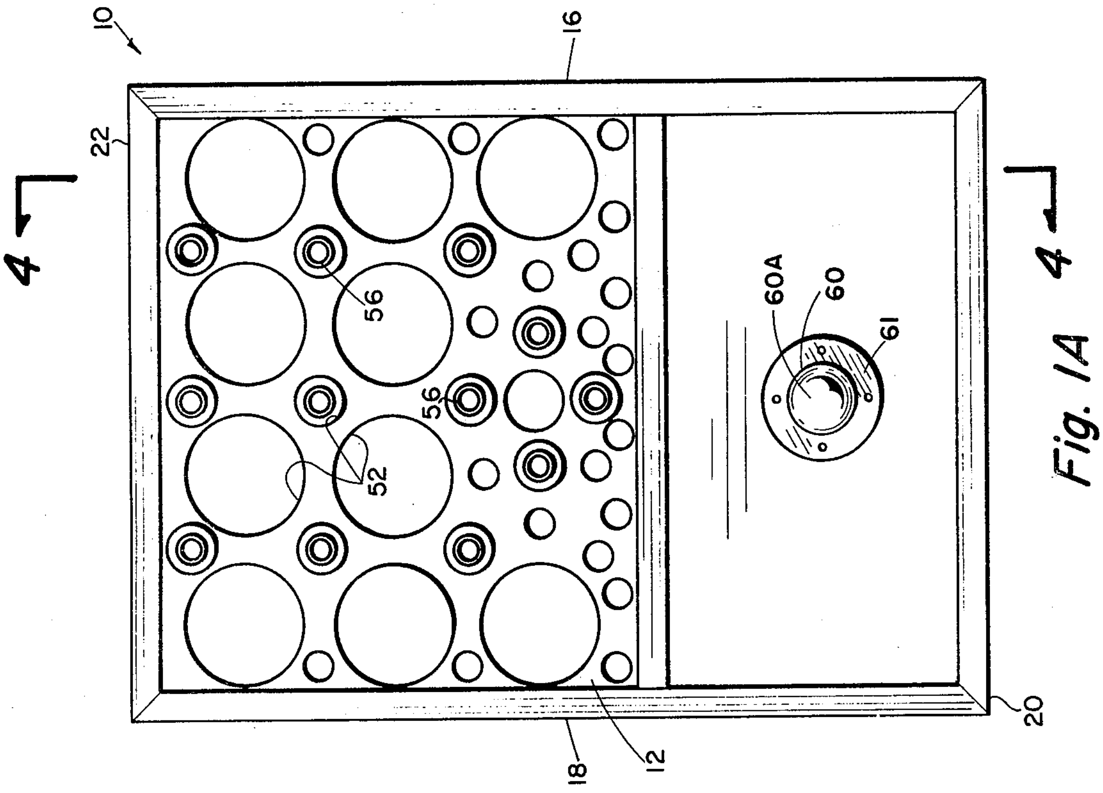
FIG. 1A is a front elevational view of a speaker cabinet embodying the principles of this invention.

The portion of the cabinet front cover 12 is provided with a number of openings 52 as shown in FIG. 1A by which sound emanates from the cabinet. The size, variety, and arrangement of the openings 52 may vary. FIG. 1B shows an alternate embodiment in which at least a portion of the openings are noncircular, such as elongated openings 54. The front panel, and particularly the upper portion thereof, may be formed of plywood or plastic to easily facilitate the provisiion of openings 52 and 54. Wave guide tubes 56 may be inserted in some of the openings 52 in the front panel 12 and held in place, such as by nuts 58 (See FIG. 4). The purpose and function of the wave guide tubes 56 is described in my U.S. Pat. No. 3,777,844.

Important features of this invention are the provision of the baffle openings 40 and baffle plates 42 of thin metal affixed over opening 40 in the partition 24. Since the speaker 38 is mounted to partition 24, it exerts in response to an electrical signal successive condensations and rarefactions of the air to either side of the partition. These pressure differentials act on each baffle plate 42 and cause it to displace. This displacement produces sound waves which are reflected by the sound board 34 outwardly through the speaker front panel 12. Baffle plates 42 are sound generating devices which are not connected electrically to an amplifier. Each of the baffle plates 42 becomes a speaker, since the sound waves or sound phase emanating from the speaker made a 180° turn in the lower chamber 26 and enters the upper chamber 30 through the baffle 42 as the condensations and rarefactions due to the to-and-fro action of the baffle plates.

Baffle openings 40 and plates 42 may be of any configuration, however, are preferably of hexagonal or circular shape, and the total area of the baffle openings 40, whether one, two or more openings are employed, and as above indicated, should not exceed about one-fourth the vibrational area of speaker 38.

The sound emanating by baffle plates 42 may travel upwardly and impinge on sounding board 34 and be reflected thereby outwardly through the openings 52 and 54 in front plate 12, or the sound generated by the baffle plates may be otherwise treated by devices illustrated in FIGS. 5 through 11B.

Figure 5:
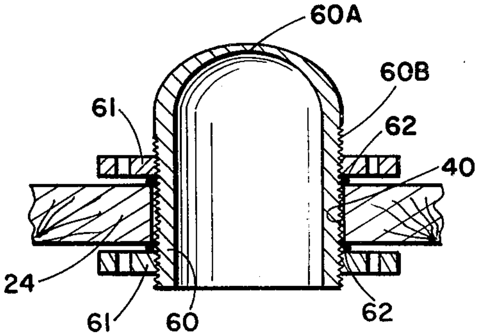

FIG. 5 illustrates another important feature of this invention--a device which is termed a wave guide sound lens 60. The sound lens 60 is a metallic tubular member with a closed end 60A. The cylindrical exterior is threaded at 60B, and the device is mounted in baffle opening 40 by means of large nuts 61. Resilient gaskets 62 prevent against extraneous sound leakage.

The closed end 60A of the sound lens is meniscus shaped or concave-convex in cross-section, as shown. The interior surface is concave, and the exterior surface is convex, with radii of curvature selected so that the center portion, which is at the tubular axis, is very thin, while the outer portion thickens to equal the wall thickness of the tubular wave guide sound 60, or the maximum thickness may be greater than the wall thickness.

The sound wave guide lens of FIG. 5 transmits the sound passing through the opening 40 in partition 24, and diffuses the sound upwardly against the inclined sounding board 34 where it is reflected outwardly through the speaker front openings.

Another way of using the sound wave guide lens of FIG. 5 is illustrated in FIG. 1A. The sound lens 60 is mounted in the lower portion of the front panel 12. In this arrangement, sound passes directly through the lens to the front exterior of the speaker. The lens diffuses and spreads the sound as it emanates from the speaker cabinet. While the sound lens 60 is shown in the center of the speaker it may be displaced to one side or the other, and may be located nearer bottom 20 or the partition 24 (not seen in FIG. 1A).

Figure 6:
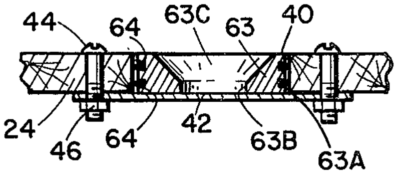

FIG. 6 shows an alternate embodiment of the sound lens. In this arrangement, a metallic ring body 63 is of a diameter to mount in opening 40 in partition 24. O-rings 64 may be used in the outer cylindrical surface 63A to prevent sound leakage. The ring 63 seats against baffle plate 42.

The upper surface 63C of ring 63 is frusto-conical in configuration, tapering to a reduced diameter central axial opening 63B. Combined with baffle plate 42, ring 63 forms an acoustical lens which spreads the sound passing therethrough, the diffused sound impinging on the inclined baffle board 34.

The ring upper surface 63C may be concave rather than conical. In addition, plate 42 may be integrally formed with ring 63. It can be seen that the acoustical lens as illustrated in FIGS. 5 and 6 may take a variety of configurations, all in keeping with the spirit and scope of the invention.

Figure 7B:
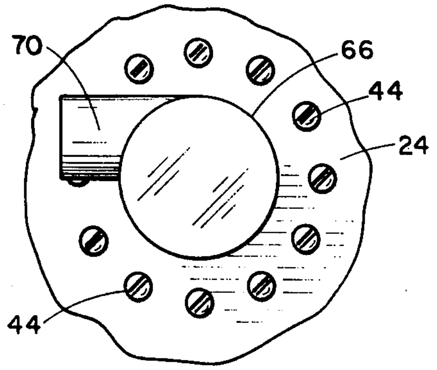
FIG. 7B is a top view of the device as shown in FIG. 7A.
Figure 7A:
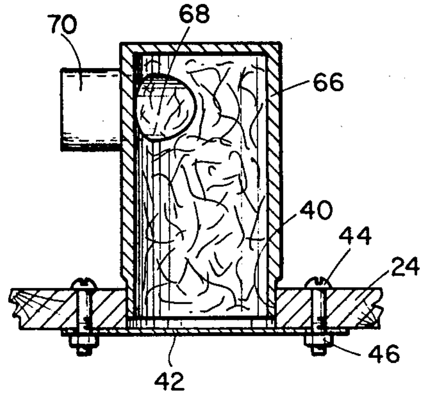
FIG. 7A is a cross-sectional view of another device for changing the sound output through the baffle plate.

FIGS. 7A and 7B show another arrangement for treating the sound passing through and generated by baffle plate 42. A closed top, open bottom vessel 66 has a lower external dimension to snugly fit the baffle opening 40. An opening 68 intersects a vessel side wall tangentially. A wave guide 70 is affixed to the vessel 66 at the opening 68 and directs the sound from baffle plate 42 in the preselected direction. The user may orient the vessel 66 so that the opened end of the guide tube 70 is directed outwardly through an opening in the front panel 12 or rearwardly to reflect off the sounding board 34. The vessel 66 is preferably filled with steel wool 71 to soften the sound passing therethrough.

Figure 8:
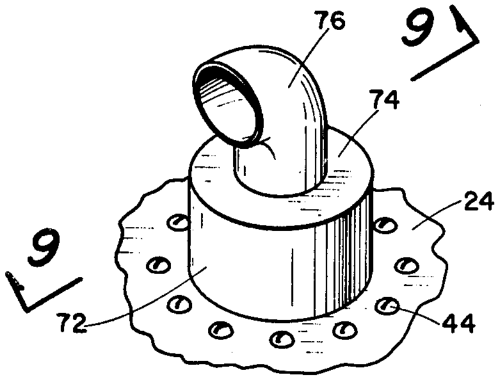
Figure 9:
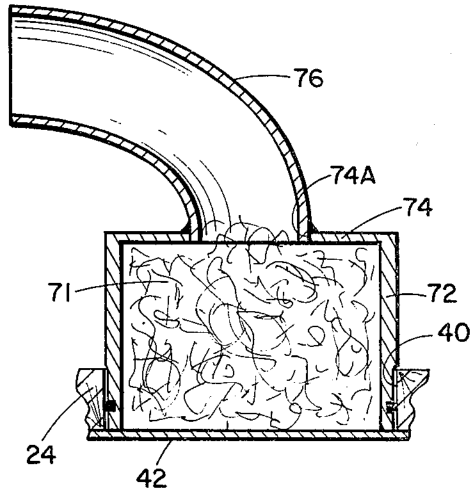

FIGS. 8 and 9 show an alternate embodiment of the arrangement of FIGS. 7A and 7B. Vessel 72 is dimensioned so that the lower portion snugly fits within the baffle opening 40 but is arranged such that the top 74 has an opening 74A having communication with a sound guide tube 76 in the form of an elbow, that is, a 90° bend, so that the device may be oriented to direct sound forwardly or rearwardly as previously described.

Figure 10:
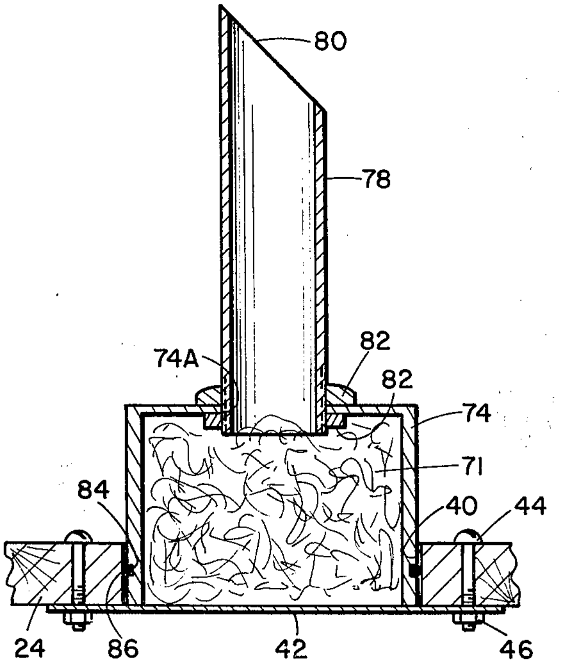

FIG. 10 shows generally the same arrangement of FIGS. 8 and 9, but wherein the sound tube 78 is not curved but extends upwardly with a truncated upper opening 80. FIG. 10 also shows the use of steel wool 71 within the interior of the vessel 74 to avoid undesirable sound reflections and to soften and mute the sound passing into the interior of the sound tube 78. Nuts 82 are employed to retain the threaded lower end of the tube 78 into opening 74A formed in the top 74 of the vessel. The lower external portion of the vessel 74 is provided with a groove 84 receiving an O-ring 86 to insure air-tight engagement of the vessel 74 and opening 40 and at the same time permit easy rotational orientation as desired by the user.

Figure 11B:
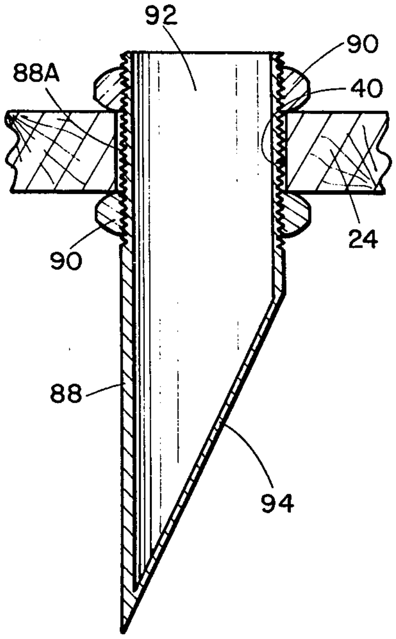
Figure 11A:
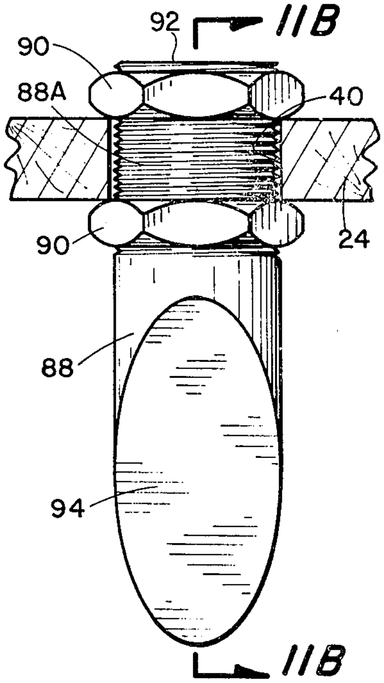
FIG. 11A is an elevational view of a sound tube having a tapered closed end which may be employed to change the sound passing through the baffle plate.

FIGS. 11A and 11B shows the use of an alternate arrangement for transmission and treatment of sound passing from through partition 24. This embodiment employs a sound wave tube 88 which has an external diameter to snugly fit opening 40 in partition 24. The sound wave tube 88 may be supported in opening 40 in a variety of ways, but a preferred arrangement is as illustrated, with external threads 88A and large nuts 90.

One end 92 of tube 88 is open. The opposite end is truncated at an acute angle relative to the tube axis. The truncated end is closed by an elliptical plate 94. Plate 94 is of very thin metal to permit the passage of sound therethrough and along the interior of the tube. The sound wave guide tube can be mounted, as illustrated with open end 92 upward, extending into chamber 30, or the closed end may be upperward. The elliptical plate 94 functions as baffle plate 42 compared to the embodiments previously described.

The speaker cabinet described provides a unique arrangement wherein baffle plates and sound lenses are utilized to function as supplemental speakers, that is, sound generating devices which are not electrically connected to an amplifier. These sound generating devices augment the sound produced by the speaker mounted within the cabinet. A variety of elements are illustrated for use to change the characteristics of the sound generated within the speaker cabinet and particularly the sounds from the baffle plate which, coupled with the use of selectable sound tube guides of various lengths and characteristics, enable the user of the speaker to customize and tune the speaker cabinet to produce the sound characteristic most desirable to himself While the invention has been described with a certain degree of particularity, it is manifest that many changes may be made in the details of construction and the arrangement of components without departing from the spirit and scope of this disclosure. It is understood that the invention is not limited to the embodiments set forth herein but is to be limited only by the scope of the attached claim or claims, including the full range of equivalency to which each element thereof is entitled.

What is claimed:

1. A cabinet for improving the sound output of an amplifier, comprising:

an upright housing having a front and a rear;

a horizontal partition dividing the interior of the housing into an upper portion and lower portion, the partition having a speaker opening and a baffle opening therein, the openings being spaced apart from each other, the area of said baffle opening being not more than one-fourth the area of said speaker opening;

a speaker mounted on said horizontal partition and covering said speaker opening therein, the speaker having a vibrational area of preselected size, the speaker being mounted for upward projection of sound through said opening into said housing upper portion, the speaker having means for connecting to the output of an amplifier;

a sounding board positioned within said housing upper portion and inclined at an angle of from about 30° to about 70° relative to said horizontal partition, the sounding board being inclined from the housing rear upwardly toward the housing front;

a metal baffle affixed to said horizontal partition and covering said baffle plate opening therein; and a front panel covering the housing upper and lower portions, the upper portion having openings therein for the emission of sound, the area of the openings being at least the vibrational area of said speaker.

2. A cabinet for improving the sound output of an amplifier according to claim 1 wherein said horizontal partition includes a plurality of baffle openings, the total area of which does not exceed one-fourth the vibrational area of said speaker and a metal baffle affixed to said partition board and covering each of said baffle openings.

3. A cabinet for improving the sound output of an amplifier according to claim 1 including a rear panel covering said cabinet upper and lower portions, said rear panel lower portion having a plurality of openings, the area of which are not more than the vibrational area of said speaker, and the rear panel upper portion having at least one opening therein, the area of which is less than the vibrational area of said speaker.

4. A cabinet for improving the sound output of an amplifier according to claim 1 including a plurality of wave guide tubes of selected lengths inserted into selected ones of said openings in said front panel upper portion.

5. A cabinet for improving the sound output of an amplifier according to claim 4 wherein said wave guide tubes are removable and insertable in said opening in said front panel as desired for tonal change.

6. A cabinet for improving the sound output of an amplifier according to claim 1 in which said sounding board is of plywood of about $\frac{1}{8}$ to $\frac{3}{8}$ inch thickness.

7. A cabinet for improving the sound output of an amplifier according to claim 1 wherein said baffle affixed to said horizontal partition and covering said baffle opening therein is in the form of a sheet of metal of about 14 gauge thickness.

* * * * *